US009529336B2

(12) United States Patent
Liu et al.

(10) Patent No.: US 9,529,336 B2
(45) Date of Patent: Dec. 27, 2016

(54) ANALOG TO DIGITAL CONVERTER COMPATIBLE WITH IMAGE SENSOR READOUT

(71) Applicant: TAIWAN SEMICONDUCTOR MANUFACTURING COMPANY, LTD., Hsinchu (TW)

(72) Inventors: Qiyuan Liu, Hsinchu (TW); Martin Kinyua, Cedar Park, TX (US); Eric Soenen, Austin, TX (US)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 30 days.

(21) Appl. No.: 14/630,929

(22) Filed: Feb. 25, 2015

(65) Prior Publication Data

US 2016/0246262 A1 Aug. 25, 2016

(51) Int. Cl.
*H03M 1/50* (2006.01)
*G04F 10/00* (2006.01)
*H03M 1/34* (2006.01)
*H04N 5/378* (2011.01)

(52) U.S. Cl.
CPC ............... *G04F 10/005* (2013.01); *H03M 1/34* (2013.01); *H04N 5/378* (2013.01)

(58) Field of Classification Search
CPC .......... G04F 10/005; H03M 1/50; H03M 1/34; H04N 5/378
USPC .................................................. 341/155, 166
See application file for complete search history.

(56) References Cited

U.S. PATENT DOCUMENTS

| | | | |
|---|---|---|---|
| 2,272,070 A | 2/1942 | Reeves | |
| 8,223,047 B2 | 7/2012 | Lai et al. | |
| 8,253,616 B2 | 8/2012 | Bogaerts | |
| 8,279,102 B2 | 10/2012 | Lai et al. | |
| 8,325,074 B2 | 12/2012 | Kinyua | |
| 8,476,971 B2 | 7/2013 | Peng et al. | |
| 8,493,259 B2 | 7/2013 | Lai et al. | |
| 8,547,259 B1 | 10/2013 | Huang et al. | |
| 8,599,057 B2 | 12/2013 | Lai et al. | |
| 8,629,795 B2 | 1/2014 | Peng et al. | |

(Continued)

OTHER PUBLICATIONS

Yoshihara, Satoshi et al., "A 1/1.8-inch 6.4 MPixel 60 frames/s CMOS Image Sensor With Seamless Mode Change", IEEE Journal of Solid-State Circuits, vol. 41, No. 12, Dec. 2006, pp. 2998-3006.

(Continued)

*Primary Examiner* — Brian Young
(74) *Attorney, Agent, or Firm* — Hauptman Ham, LLP

(57) ABSTRACT

A time to digital converter (TDC) includes a synchronizer configured to receive a stop signal and a master clock signal, wherein the synchronizer is configured to generate a clock stop signal and a counter enable signal. The TDC further includes a coarse counter configured to receive the master clock signal and the counter enable signal, wherein the coarse counter is configured to generate a most significant bits (MSB) signal based on the counter enable signal and the master clock signal. The TDC further includes a delay line counter configured to receive the stop signal and the clock stop signal, wherein the delay line counter is configured to generate a least significant bits (LSB) signal based on the stop signal and the clock stop signal, and the delay line counter is further configured to perform correlated double sampling (CDS).

20 Claims, 6 Drawing Sheets

(56) References Cited

U.S. PATENT DOCUMENTS

| | | | |
|---|---|---|---|
| 8,724,001 B2 | 5/2014 | Ay | |
| 8,810,676 B2 | 8/2014 | Lim et al. | |
| 8,822,933 B2 * | 9/2014 | Fries | A61B 6/037 250/363.03 |
| 8,872,686 B2 | 10/2014 | Chou et al. | |
| 8,970,421 B1 * | 3/2015 | Gao | G04F 10/005 341/166 |
| 9,007,133 B2 * | 4/2015 | Cremonesi | H03K 3/0315 327/141 |
| 9,124,280 B2 * | 9/2015 | Kim | G04F 10/005 |
| 2013/0009795 A1 | 1/2013 | Soenen et al. | |
| 2014/0159932 A1 | 6/2014 | Chang et al. | |

OTHER PUBLICATIONS

Naraghi, Shahrzad et al., "A 9-bit, 14 µW and 0.06 mm2 Pulse Position Modulation ADC in 90 nm Digital CMOS", IEEE Journal of Solid-State Circuits, vol. 45, No. 9, Sep. 2010, pp. 1870-1881.

Takahashi, Tomohiro, et al., "A Digital CDS Scheme on Fully Column-Inline TDC Architecture for an APS-C Format CMOS Image Sensor", Symposium on VLSI Circuits Digest of Technical Papers, 2011, pp. 90-91.

Office Action dated Oct. 21, 2016 from corresponding application No. TW 104138900.

* cited by examiner

ANALOG TO DIGITAL CONVERTER COMPATIBLE WITH IMAGE SENSOR READOUT

BACKGROUND

Analog to digital converters (ADCs) are used in a variety of applications in order to convert a detected analog signal into a digital signal. As technology nodes decrease, supply voltages also decrease. However, time resolution has increased in response to decreasing technology nodes. As a result, time to digital converters (TDCs) are used to perform time-domain processing to convert detected signals into digital signals.

In some approaches, a counter is used to determine a number of clock cycles between a start signal of a reference voltage and a clock stop signal which occurs after the reference voltage is equal to a voltage of the detected analog signal. A frequency of the clock used for the counter is determined based on a number of detecting elements connected to the counter. In some approaches, the counter is separated into a coarse counter and a fine counter. The coarse counter is used to determine a number of clock cycles, while the fine counter is used to interpolate between clock cycles using various delays of the clock.

In some approaches, the coarse counter and the fine counter are used sequentially in order to convert the detected signal into a digital signal. The coarse counter is used to count a number of cycles between the start signal and the clock stop signal; and the fine counter is used to count a number of cycles between a stop signal and the clock stop signal. The stop signal occurs when the reference voltage is equal to the voltage of the detected signal. A difference between the number of cycles counted by the coarse counter and a number of cycles counted by the fine counter is used to determine the time domain which is converted into the digital signal.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
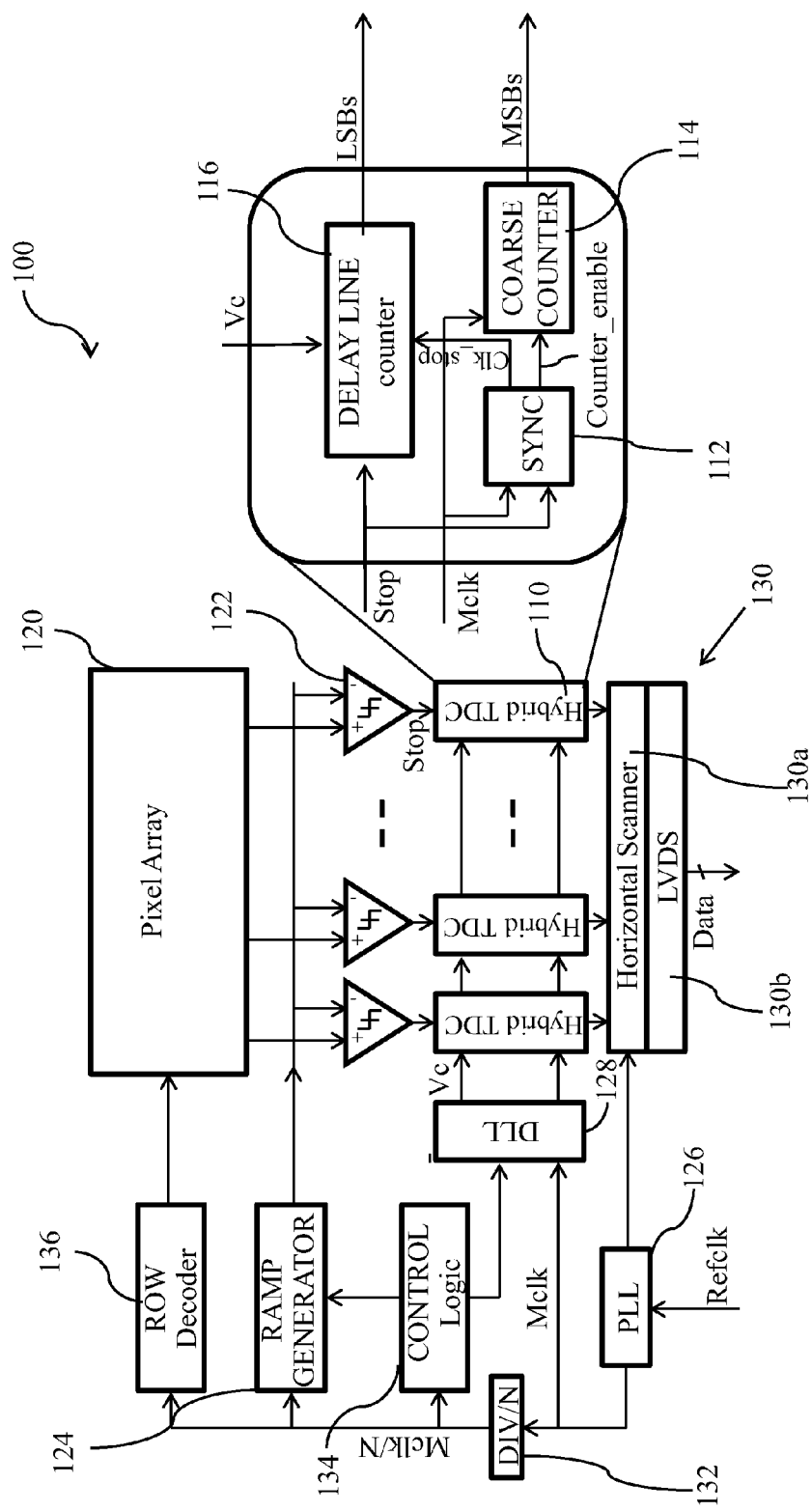
FIG. 1 is a schematic diagram of an image sensor including a time to digital converter (TDC) in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a schematic diagram of an image sensor 100 including a time to digital converter (TDC) 110 in accordance with some embodiments. Image sensor 100 includes a pixel array 120 for receiving incident light and converting the received light into an electrical signal. Comparators 122 are configured to receive an output from a column of pixel array 120. Each comparator 122 is configured to receive the output of one column of pixel array 120. Comparators 122 are also configured to receive a ramp voltage from a ramp generator 124. An output of each comparator 122 is receivable by a TDC 110. TDC 100 is also configured to receive a master clock signal (Mclk) from a phase locked loop (PLL) 126; and a control signal Vc from a delay locked loop(DLL) 128. An output of each TDC 110 is receivable by an output device 130. Output device 130 includes a horizontal scanner 130a and a low voltage differential signal (LVDS) circuit 130b. A divider 132 is configured to receive Mclk and output Mclk divided by a predetermined value N. A control logic circuit 134 is configured to receive the divided Mclk and output control signals to DLL 128 and ramp generator 124. Ramp generator is also configured to receive the divided Mclk signal. A row decoder 136 is also configured to receive the divided Mclk signal. Row decoder 136 is configured to selectively activate a row of pixels within pixel array 120.

Each TDC 110 includes a synchronizer 112 configured to receive a stop signal from a corresponding comparator 122. Synchronizer 112 is also configured to receive Mclk. An output of synchronizer 112 is receivable by a coarse counter 114 as a counter enable (counter_enable) signal. Coarse counter 114 is also configured to receive Mclk. Coarse counter 114 is configured to output a most significant bits (MSB) signal to output device 130. The output of synchronizer 112 is receivable by a delay line counter 116 as a clock stop (clk_stop) signal. Delay line counter 116 is also configured to receive the stop signal and the control signal Vc. Delay line counter 116 is configured to output a least significant bits (LSB) signal to output device 130.

Each TDC 110 is configured to convert the stop signal from a corresponding comparator 122 from a time domain signal to a digital signal. Synchronizer 112 is configured to use Mclk and the stop signal to determine a start time for generating the counter_enable signal to activate coarse counter 114. The counter_enable signal activates coarse counter 114 from the start time until a second rising edge of Mclk after the stop signal. The second rising edge of Mclk after the stop signal is used in order to reduce a risk of error in TDC 110 due to jitter. If a later rising edge of Mclk is used to de-activate coarse counter 114, a speed of TDC 110 is reduced, in some instances. If an earlier rising edge of Mclk is used to de-activate coarse counter 114, a risk of error in the output of TDC 110 is increased, in some instances. Synchronizer 112 is also configured to use Mclk and the stop signal to generate the clk_stop signal at the second rising edge of Mclk following the stop signal. The clk_stop signal is usable an end time for measuring by delay line counter 116.

Figure 2:
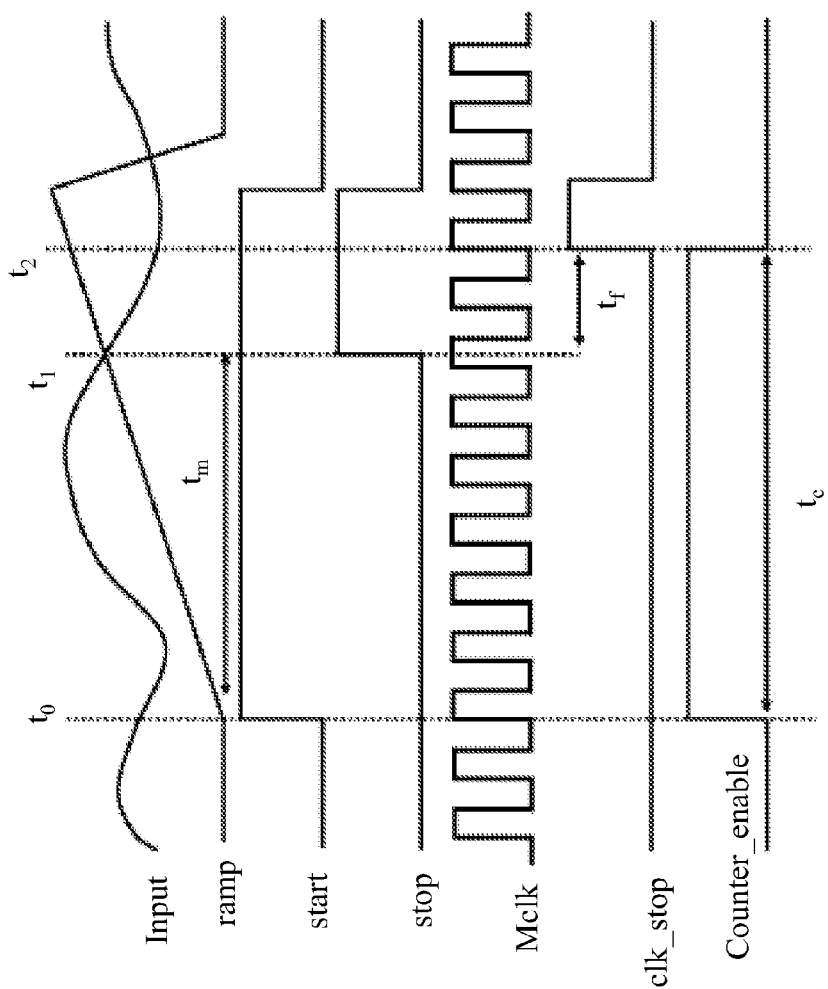
FIG. 2 is a diagram of waveforms for a comparator and a TDC in accordance with some embodiments.

An operation of TDC 110 and corresponding comparator 122 is explained with respect to FIG. 2. FIG. 2 is a diagram of waveforms for a comparator 122 and a TDC 110 in accordance with some embodiments. At time t0 a ramp voltage received by comparator 122 begins to increase; a start signal becomes logically high; and the counter_enable signal becomes logically high. In some embodiments, time t0 is called a start time. The counter_enable signal activates coarse counter 114 and the coarse counter begins counting a number of cycles of Mclk. Ramp voltage increases from time t0 and becomes equal to the input signal received by comparator 122 from pixel array 120 at time t1. In some instances, time t1 is called a stop time. At time t1, the stop signal becomes logically high. The stop signal causes delay line counter 116 to begin counting for a time period from the stop time until the second rising edge of Mclk after the stop time. A time t2 is the second rising edge of Mclk following time t1. In some embodiments, time t2 is called an end time. At time t2, the counter_enable signal becomes logically low; and the clk_stop signal becomes logically high. Once the ramp voltage reaches a maximum value, the ramp voltage is discharged back to a reference voltage. A time domain component of the input signal, i.e., a time period tm, is determined by subtracting a duration delay line counter 116 is encoding the stop signal, i.e., time period tf, from a duration of operation of coarse counter 114, i.e., a time period tc. That is, tm=tc−tf. A slope of the ramp voltage and time period tm are usable to determine the value of the input signal.

Returning to FIG. 1, synchronizer 112 is configured to synchronize the counter_enable signal with a measurement time period, e.g., time period tm (FIG. 2). Synchronizer 112 is further configured to transition a logic state of the clk_stop signal on a second rising edge of Mclk following receiving the stop signal from comparator 122. In some embodiments where speed of evaluation has priority over precision of TDC 110, synchronizer 112 is configured to transition the logic state of the clk_stop signal earlier than the second rising edge of Mclk following receipt of the stop signal. In some embodiments where precision is a higher priority, synchronizer 112 is configured to transition the logic state of the clk_stop signal later than the second rising edge of Mclk following receipt of the stop signal. In some embodiments, synchronizer 112 includes a plurality of flip-flops. In some embodiments, a number of flip-flops in synchronizer 112 is determined by a delay between receipt of the stop signal and transition of the clk_stop signal. In some embodiments, synchronizer 112 includes at least one latch.

Counter 114 is configured to determine a number of clock cycles of Mclk during the measurement time period in respect to the counter_enable signal from synchronizer 112. Counter 114 includes an encoder configured to encode the number of clock cycles of Mclk during the measurement time period. In some embodiments, counter 114 is configured to output the number of time periods as a thermometer code. A thermometer code is a binary code which includes an increasing number of digits as a voltage level received by counter 114 increases. In some embodiments, the thermometer code is expressed as N "1's" followed by a "0" when the voltage is equal to N volts. In some embodiments, the thermometer code is expressed as N "0's" followed by a "1" when the voltage is equal to N volts. An output of counter 114 includes the MSB of the input signal.

Delay line counter 116 is configured to determine a length of a time period between receipt of the stop signal and an end time, e.g., time period tf (FIG. 2). Delay line counter 116 includes an encoder configured to encode the number of clock cycles of Mclk from receipt of the stop signal to the end time. In some embodiments, delay line counter 116 is configured to output the length of the time period as a thermometer code. An output of delay line counter 116 includes the LSB of the input signal.

Figure 3:
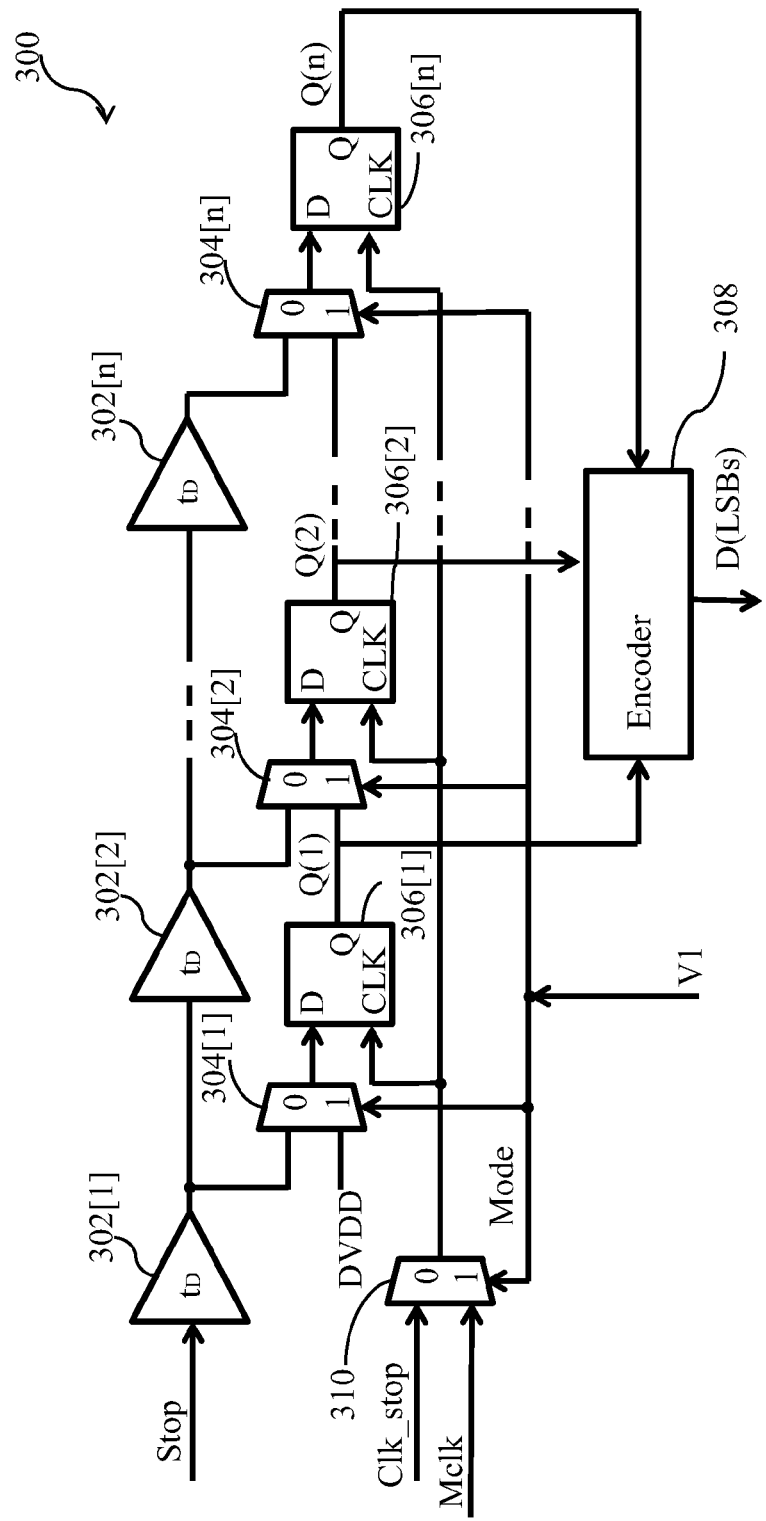
FIG. 3 is a schematic diagram of a delay line counter of a TDC in accordance with some embodiments.

FIG. 3 is a schematic diagram of a delay line counter 300 of a TDC in accordance with some embodiments. In some embodiments, delay line counter 300 is used as delay line counter 116 (FIG. 1). Delay line counter 300 includes a plurality of delay elements 302[1], 302[2] . . . 302[n]. A first delay element 302[1] is configured to receive a stop signal from a comparator. In some embodiments, the stop signal is received from comparator 122. Each successive delay element 302[2] . . . 302[n] is configured to receive an output from a preceding delay element. Delay line counter 300 also includes a plurality of delay multiplexers 304[1], 304[2] . . . 304[n]. Each delay multiplexer 304[1], 304[2] . . . 304[n] is configured to receive the output from a corresponding delay element 302[1], 302[2] . . . 302[n] at a first input. Each delay multiplexer 304[1], 304[2] . . . 304[n] is also configured to receive a mode signal at a selection input. A first delay multiplexer 304[1] is configured to receive a predetermined voltage DVDD at a second input. Delay line counter 300 further includes a plurality of flip-flops 306[1], 306[2] . . . 306[n]. Each flip-flop 306[1], 306[2] . . . 306[n] is configured to receive an output of a corresponding delay multiplexer 304[1], 304[2] . . . 304[n] at a data input. An output of each flip-flop 306[1], 306[2] . . . 306[n] is receivable by an encoder 308 and a next delay multiplexer 304[2] . . . 304[n]. Encoder 308 is configured to receive the output of each flip-flip 306[1], 306[2] . . . 306[n] and convert the outputs to an LSB output signal. Delay line counter 300 further includes a clock multiplexer 310. Clock multiplexer 310 is configured to receive a clk_stop signal at a first input and Mclk at a second input. In some embodiments, the clk_stop signal is provided by a synchronizer, e.g., synchronizer 112. In some embodiments, Mclk is provided by a PLL, e.g., PLL 126. Clock multiplexer 310 is further configured to receive the mode signal at a selection input. An output of clock multiplexer 310 is receivable by each flip-flop 306[1], 306[2] . . . 306[n] at a clock input of the flip-flop. The mode signal is determined based on an input signal V1.

Each delay element 302[1], 302[2] . . . 302[n] is configured to delay an input by a predetermine delay amount. In some embodiments, at least one delay element 302[1], 302[2] . . . 302[n] includes serial inverters. In some embodiments, at least one delay element 302[1], 302[2] . . . 302[n] includes a control transistor for selectively connecting at least one inverter of the delay element to a reference voltage. In some embodiments, each delay element 302[1], 302[2] . . . 302[n] has a same structure. In some embodiments, at least one delay element 302[1], 302[2] . . . 302[n] has a different structure from at least one other delay element.

Each delay multiplexer 304[1], 304[2] . . . 304[n] is configured to switch the data input to a corresponding flip-flop 306[1], 306[2] . . . 306[n] in response to the mode signal. In a first mode where the delay multiplexers 304[1], 304[2] . . . 304[n] are outputting the first input, i.e., the output from a corresponding delay element 302[1], 302[2] . . . 302[n], delay line counter 300 is outputting a digital representation of the stop signal. In a second mode where the delay multiplexers 304[1], 304[2] . . . 304[n] are outputting the second input, i.e., the output from predetermined voltage DVDD or a preceding flip-flop 306[1], 306[2] . . . 306[n], delay line counter 300 is outputting a digital representation of a reference signal.

Accuracy of the output of the delay line counter 300 is improved using correlated double sampling (CDS). CDS compares an output of a circuit at a reference value with an output of the circuit receiving a test value. The output of the circuit at the reference value provides a basis for determining latent errors within the output of the circuit. By subtracting the output of the circuit receiving the reference value from the output of the circuit receiving the test value, a more accurate representation of the test value is obtained. Delay line counter 300 is able to performed CDS by subtracting the output in the second mode from the output in the first mode. Performing CDS on the output of delay line counter 300 increases an accuracy of the digital representation of the stop signal.

Each flip-flop 306[1], 306[2] . . . 306[n] is configured to provide an output to encoder 308 based on a specific delay of the stop signal during the first mode. The output from each flip-flop 306[1], 306[2] . . . 306[n] represents an LSB of the stop signal during the first mode. In the second mode, each flip-flop 306[1], 306[2] . . . 306[n] is configured to provide an output to encoder 308 based on the predetermined voltage DVDD in order to help determine any latent errors within the flip-flops.

Encoder 308 is configured to receive the outputs from each flip-flop 306[1], 306[2] . . . 306[n] and convert the outputs into the LSB output signal. In some embodiments, LSB output signal is a thermometer code. In some embodiments, the LSB output signal is a 5-bit signal. In some embodiments, LSB output signal is different from a 5-bit signal.

Clock multiplexer 310 is configured to change the clock input for each flip-flop 306[1], 306[2] . . . 306[n] based on a mode of delay line counter 300. Clock multiplexer 310 is usable to enable each flip-flop 306[1], 306[2] . . . 306[n] to generate an output based on input from a corresponding delay element 302[1], 302[2] . . . 302[n] during the first mode. Clock multiplexer 310 is usable to enable each flip-flop 306[1], 306[2] . . . 306[n] to generate an output based on predetermined voltage DVDD during the second mode. Using clock multiplexer 310 helps to facilitate CDS within delay line counter 300 by controlling the output of flip-flops 306[1], 306[2] . . . 306[n].

In some embodiments, input signal V1 is provided by an external circuit. In some embodiments, input signal V1 is determined based on the clk_stop signal. For example, the clk_stop signal in FIG. 2 becomes logically high following a measurement period for the input signal. Switching between the first mode and the second mode of delay line counter 300 based on the clk_stop signal in FIG. 2 permits periodic measurement of a reference output of the delay line counter for CDS, in some embodiments. Measuring the reference output after each measurement period for the input signal helps to account for drift within delay line counter 300 over time, which in turn increases the accuracy of the delay line counter.

Returning to FIG. 1, pixel array 120 is configured to capture incident light and convert the incident light into electrical signals. Pixel array 120 includes pixels arranged in rows and columns. Pixel array 120 receives a row decoder signal from row decoder 136. A row of pixels within pixel array 120 are activated in response to the row decoder signal. The activated pixels detect the incident light. The electrical signals from the activated pixels are transferred to corresponding comparators 122 in a columnar fashion, i.e., each column of pixels of pixel array 120 is connected to a corresponding comparator. In some embodiments, more than one comparator 122 is coupled to each column of pixel array 120 in order to reduce power consumption of image sensor 100 by facilitating a lower clock frequency. In some embodiments, each comparator 122 is coupled to more than one column of pixel array 120 in order to reduce a size of image sensor 100. In some embodiments, the pixels of pixel array 120 include photodiodes. In some embodiments, pixel array 120 includes at least 8.3M pixels. In some embodiments, pixel array 120 includes more than or less than 8.3M pixels.

Comparators 122 are configured to compare an input signal from pixel array 120 with a ramp voltage from ramp generator 124. When the ramp voltage equals the input signal, comparators 122 are configured to generate the stop signal. A non-limiting example of generation of the stop signal is provided with respect to the discussion of FIG. 2 above. Comparators 122 are configured to provide the stop signal to a corresponding TDC 110. In some embodiments, each comparator 122 is selectively connected to more than one TDC 110. In some embodiments, more than one comparator 122 is selectively connected to a same TDC 110.

Figure 4:
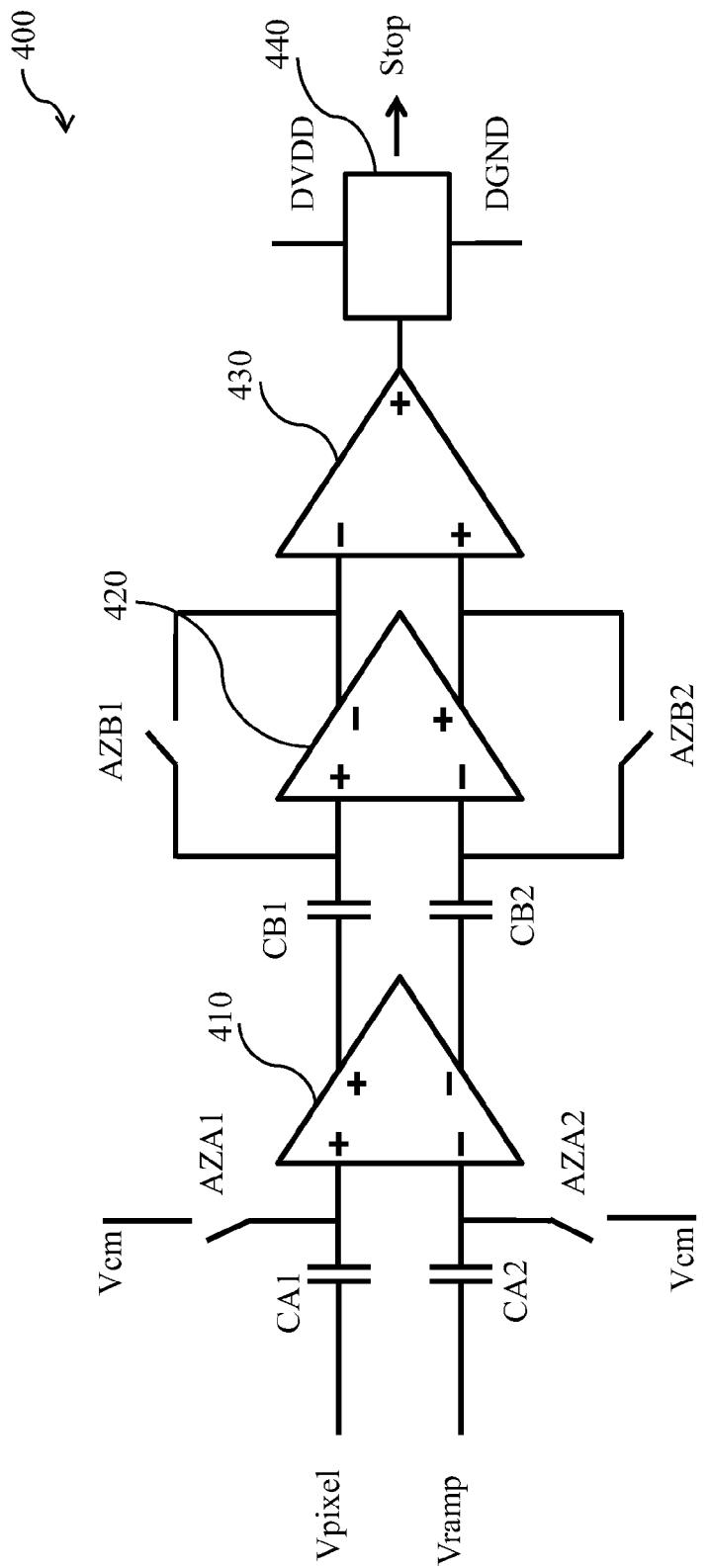
FIG. 4 is a schematic diagram of a comparator in accordance with some embodiments.

FIG. 4 is a schematic diagram of a comparator 400 in accordance with some embodiments. In some embodiments, comparator 400 is used as comparator 122 (FIG. 1). Comparator 400 includes a capacitor CA1 configured to receive an input signal Vpixel, e.g., a column output from pixel array 120 (FIG. 1). Capacitor CA1 is connected to a first input of a comparing element 410. Comparator 400 further includes a capacitor CA2 configured to receive a ramp voltage Vramp, e.g., the ramp voltage from ramp generator 124. Capacitor CA2 is connected to a second input of comparing element 410. The first input of comparing element 410 is selectively connected to a common voltage Vcm by a switch AZA1. The second input of comparing element 410 is selectively connected to common voltage Vcm by switch AZA2. A first output of comparing element 410 is connected to a capacitor CB1. A second output of comparing element 410 is connected to a capacitor CB2. Capacitor CB1 is also connected to a first input of comparing element 420. Capacitor CB2 is also connected to a second input of comparing element 420. A first output of comparing element 420 is connected to a first input of a comparing element 430; and a second output of comparing element 420 is connected to a second input of comparing element 430. Capacitor CB1 is also selectively connectable to the first input of comparing element 430 by a switch AZB1. Capacitor CB2 is also selectively connectable to the second input of comparing element 430 by a switch AZB2. Switches AZB1 and AZB2 are usable to by-pass comparing element 420. An output of comparing element 430 is connected to a level shifter 440. Level shifter 440 is configured to output the stop signal from comparator 400.

In some embodiments, capacitor CA1 has a same capacitance as capacitor CA2. In some embodiments, capacitor CA1 has a different capacitance from capacitor CA2. In some embodiments, a capacitance of capacitor CA1 and capacitor CA2 independently range from about 0.9 picofarads (pF) to about 1.2 pF. In some embodiments, common voltage Vcm ranges from about 0.6 volts (V) to about 1.2 V.

A capacitance of capacitor CB1 and a capacitance of capacitor CB2 are less than a capacitance of at least one of capacitor CA1 or capacitor CA2. In some embodiments, capacitor CB1 has a same capacitance as capacitor CB2. In some embodiments, capacitor CB1 has a different capacitance from capacitor CB2. In some embodiments, a capacitance of capacitor CB1 and capacitor CB2 independently range from about 500 femtofarads (fF) to about 800 fF.

Comparing element 410 is configured to provide a high bandwidth comparison between Vpixel and Vramp. Comparing element 410 is configured to exhibit a small delay variation in order to help offset variation in comparing element 420 and comparing element 430. By selectively connecting comparing element 410 to common voltage Vcm, comparing element 410 is able to be reset which helps to reduce fixed pattern noise within Vpixel.

Comparing element 420 and comparing element 430 are configured to provide low bandwidth comparison between the first output of comparing element 410 and the second output of comparing element 410. Comparing element 420 and comparing element 430 help to filter out noise from comparing element 410. In some instances where processing speed is a higher priority than signal accuracy comparing element 420 is by-passed using switches AZB1 and AZB2. In some instances where signal accuracy is a higher priority than processing speed the outputs from comparing element 410 propagate through both comparing element 420 and comparing element 430.

Level shifter 440 is configured to adjust a voltage level of the stop signal to match a voltage domain in a TDC, e.g., TDC 110 (FIG. 1) or TDC 300 (FIG. 3). In some embodiments, DVDD ranges from about 0.6 V to about 1.2 V. In some embodiments, a same voltage DVDD is used in both comparator 400 and a corresponding TDC, e.g., TDC 110 or TDC 300. DGND is the ground supply voltage, which is nominally equal to 0 V.

Returning to FIG. 1, ramp generator 124 is configured to provide the ramp voltage to comparators 122 for comparison with the input signal from pixel array 120. Ramp generator 124 is configured to provide the ramp voltage having a constant voltage slope versus time in order to facilitate conversion of the input signal from pixel array 120 into a digital signal. Ramp generator 124 is configured to receive a reset signal and a ramp enable signal from control logic 134 and a divided clock signal from divider 132. Ramp generator 124 includes a variable current generator in order to generate the ramp voltage.

Figure 5:
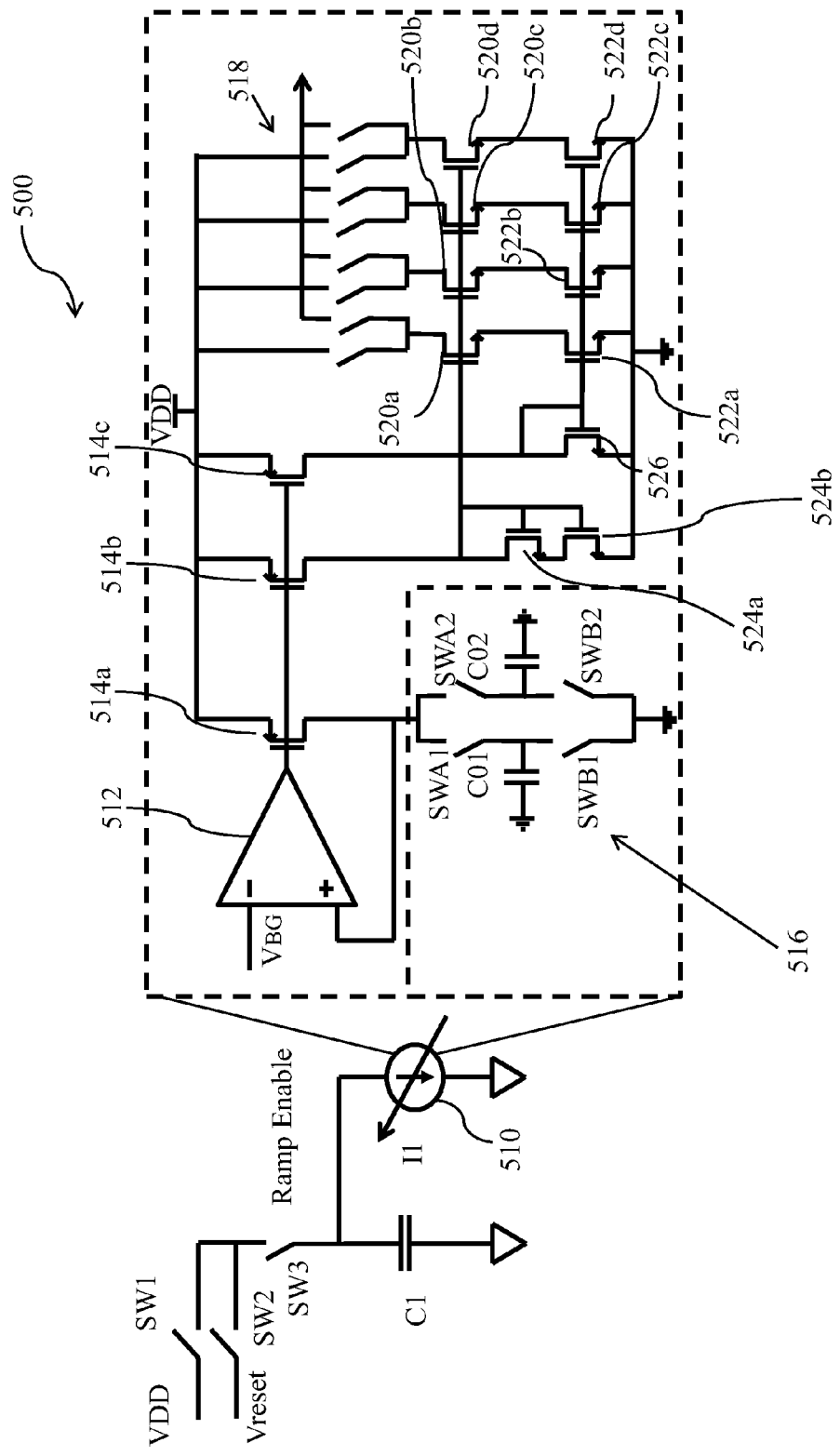
FIG. 5 is a schematic diagram of ramp generator in accordance with some embodiments.

FIG. 5 is a schematic diagram of ramp generator 500 in accordance with some embodiments. In some embodiments, ramp generator 500 is usable as ramp generator 124 (FIG. 1). Ramp generator 500 includes a switch SW1 configured to receive an operating voltage VDD and a switch SW2 configured to receive a reset voltage Vreset. Switch SW1 and switch SW2 are selectively activated based on a received reset signal, e.g., the reset signal from control logic 134. A switch SW3 is connected to switch SW1 and switch SW2. Switch SW3 is selectively activated based on a ramp enable signal, e.g., the ramp enable signal from control logic 134. Ramp generator 500 further includes a capacitor C1 connected between switch SW3 and a reference voltage. A ramp current generator 510 is connected in parallel with capacitor C1. Ramp current generator 510 is a current generator configured to cause ramp generator 500 to provide a ramp voltage having a constant voltage slope with respect to time.

Ramp current generator 510 includes a amplifier 512 configured to receive a band gap voltage Vbg at a first input and a feedback signal at a second input. An output of amplifier 512 is connected to a gate of mirror transistors 514a, 514b and 514c. A first terminal of each mirror transistor 514a, 514b and 514c are configured to receive the operating voltage VDD. A second terminal of mirror transistor 514a is connected to the second input of comparator 512. The second terminal of mirror transistor 514a is connected to a switch capacitor resistor 516. A second terminal of mirror transistor 514b is connected to gates of transistors 520a-520d. The second terminal of mirror transistor 514b is connected to diode-connected transistors 524a and 524b. A second terminal of mirror transistor 514c is connected to gates of transistors 522a-522d. The second terminal of mirror transistor 514c is connected to diode-connected transistor 526. A slope control section 518 is connected between operating voltage VDD and transistors 520a-520d. Slope control section 518 is configured to provide an output current from ramp current generator 510.

Switch capacitor resistor 516 includes a capacitor C01 selectively connected to mirror transistor 514a through a switch SWA1. Switch capacitor resistor 516 further includes a capacitor C02 selectively connected to mirror transistor 514a through a switch SWA2. A switch SWB1 is configured to selectively connect capacitor C01 to the reference voltage. A switch SWB2 is configured to selectively connect capacitor C02 to the reference voltage. Including switch capacitor resistor 516 helps to maintain a constant slope for the ramp voltage of ramp generator 500. Setting a capacitance of capacitors C01 and C02 with respect to capacitor C1 provides coarse control over the slope of the ramp voltage.

Slop control section 518 includes a plurality of switches configured to selectively connect a corresponding transistor of transistors 520a-520d to operating voltage VDD. By selectively activating switches of the plurality of switches in slope control section 518, a slope of the ramp voltage from ramp generator 500 is able to be adjusted. Slope control section 518 helps to fine tune the slope of the ramp voltage, which coarsely defined based on the capacitance of capacitors C1, C01, and C02.

In operation, the current mirrored through mirror transistor 514b is determined based on a resistance provided by switched capacitor resistor 516. The current through mirror transistor 514b biases transistors 520a-520d. The current mirrored through mirror transistor 514c is determined based on a resistance provided by switched capacitor resistor 516. The current through mirror transistor 514c biases transistors 522a-522d. A aspect ratio of transistors 520a-520d and a aspect ratio of transistor s 522a-522d provide different currents to the switches of slope control section 518. By selectively activating the switches of slope control section 518, the slope of the ramp voltage is adjusted. In some embodiments, at least one transistor of transistors 520a-520d has a different transistor size from at least one other transistor of transistors 520a-520d in order to provide a different current to corresponding switches of slope control section 518. In some embodiments, at least one transistor of transistors 522a-522d has a different transistor size from at least one other transistor of transistors 522a-522d in order to provide a different current to corresponding switches of slope control section 518.

Returning to FIG. 1, PLL 126 is configured to maintain a frequency of Mclk with respect to a reference clock signal Refclk. PLL 126 is configured to receive the reference clock signal Refclk from external circuitry and to provide Mclk to divider 132, TDCs 110 and output device 130.

DLL 130 is configured to receive a signal from control logic 134 and generate control signal Vc. In some embodiments, control signal Vc is usable in TDC 110 to select the mode of delay line counter 116.

Output device 130 is configured to receive the outputs of TDCs 110 and Mclk from PLL 126. Horizontal scanner 130a is configured scan the outputs from TDCs 110 along a row direction of pixel array 120 in order to maintain positional information for the detected incident light in pixel array 120. LVDS 130b is configured to output a differential signal based on the outputs from TDCs 110 via horizontal scanner 130a. LVDS 130b helps to reduce noise by sensing a differential voltage instead of a common mode voltage. Output Data of output device 130 is a digital signal. In some embodiments, output Data is receivable by external circuitry for producing an image based on the detected light from pixel array 120; for analysis of the detected light from the pixel array; for storing information directed to the detected light from the pixel array; or another suitable purpose.

Divider 132 is configured to divide Mclk by a predetermined value N and supply the divided Mclk signal to control logic 134, ramp generator 124 and row decoder 136. In some embodiments, predetermined value N is equal to a number of columns in pixel array 120. In some embodiments, predetermined value N is equal to a number of TDCs 110. In some embodiments, predetermined value N is different from the number of columns in pixel array 120 and the number of TDCs 110.

Control logic 134 is configured to control ramp generator 124 and DLL 128. In some embodiments DLL 128 is omitted.

Row decoder 136 is configured to selectively activate row of pixel array 120 so that information captured by pixels within the activated row are read out to comparators 122 and TDCs 110. Row decoder 136 is configured to receive the divide Mclk signal from divider 132.

Figure 6:
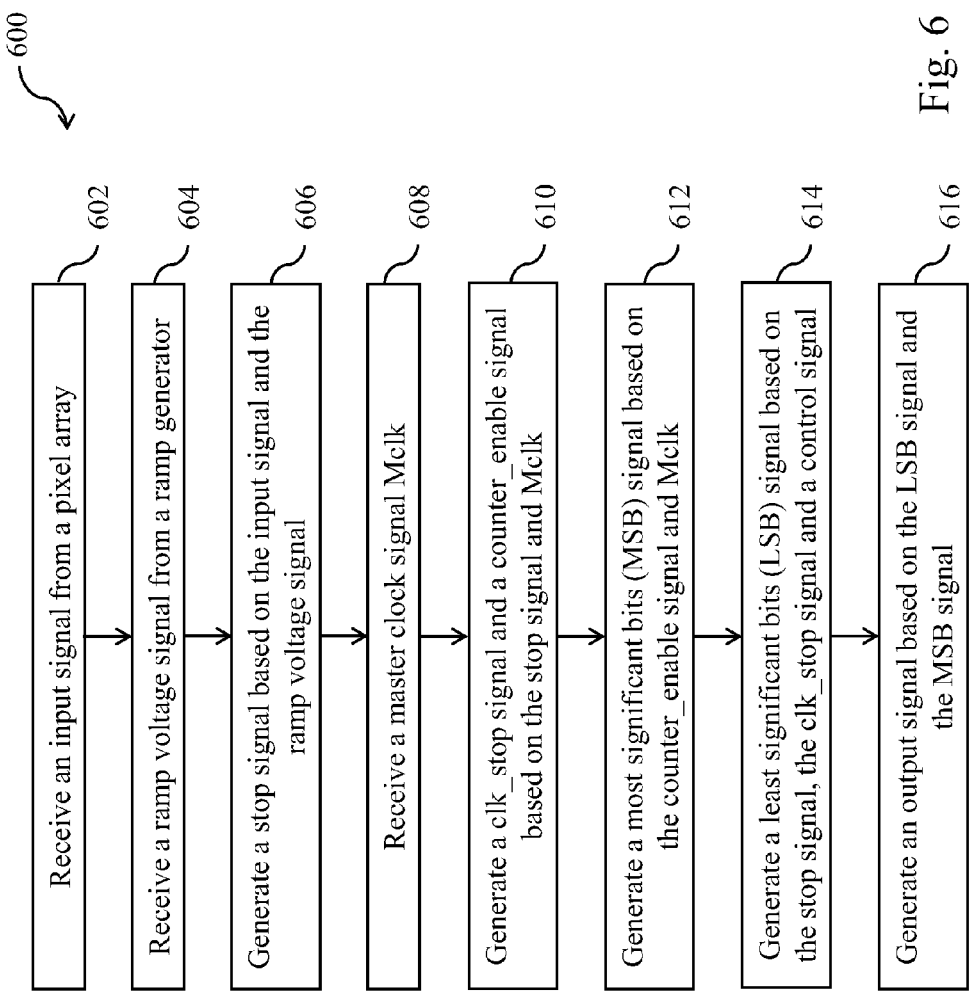
FIG. 6 is a flow chart of a method of using an image sensor in accordance with some embodiments.

FIG. 6 is a flow chart of a method 600 of using an image sensor in accordance with some embodiments. Method 600 begins with operation 602 in which an input signal is received from a pixel array. In some embodiments, the input signal is an analog signal. In some embodiments, the input signal is received from at least one column of the pixel array. In some embodiments, the pixel array is pixel array 120 (FIG. 1). In some embodiments, the input signal is received by at least one comparator, e.g., comparator 122 or comparator 400 (FIG. 4). In some embodiments, multiple input signals are received from the pixel array. In some embodiments, a number of input signals is equal to a number of columns in the pixel array. In some embodiments, the number of input signals is different from the number of columns in the pixel array.

In operation 604, a ramp voltage is received from a ramp generator. The ramp voltage has a substantially constant voltage slope with respect to time. A substantially constant slope for the ramp voltage helps to increase an accuracy of an output of the image sensor. In some embodiments, the ramp generator is ramp generator 124 (FIG. 1) or ramp generator 500 (FIG. 5). In some embodiments, the ramp voltage is received by the comparator, e.g., comparator 122 (FIG. 1) or comparator 400 (FIG. 4).

In operation 606, a stop signal is generated based on the input signal and the ramp voltage signal. The stop signal is generated when the ramp voltage is equal to the input signal. In some embodiments, the stop signal is generated by the comparator, e.g., comparator 122 (FIG. 1) or comparator 400 (FIG. 4).

A master clock signal Mclk is received in operation 608. The master clock signal Mclk is used to convert the input signal from a time domain signal to a digital signal. In some embodiments, the master clock signal Mclk is received by a synchronizer of a TDC, e.g., synchronizer 112 (FIG. 1). In some embodiments, the master clock signal Mclk is received by a coarse counter of the TDC, e.g., coarse counter 114.

In operation 610, a clk_stop signal and a counter enable signal are generated based on the stop signal and the master clock signal Mclk. The clk_stop signal is used to identify an end of the measurement time period, e.g., tc (FIG. 2). In some embodiments, the clk_stop signal is generated on a second rising edge of the master clock signal Mclk after the stop signal is received. In some embodiments, the clk_stop signal is generated before or after the second rising edge of the master clock signal Mclk after the stop signal is received. In some embodiments, the clk_stop signal is generated by the synchronizer, e.g., synchronizer 112. In some embodiments, the clk_stop signal is provided to a delay line counter, e.g., delay line counter 116, to generate the LSBs and increase accuracy of an output of the image sensor.

The counter_enable signal is generated to correspond to a time of the master clock signal Mclk where the ramp voltage begins to increase. The counter_enable signal is used to activate the coarse counter, e.g., coarse counter 114 (FIG. 1). In some embodiments, the counter_enable signal is used to de-activate the coarse counter at the second rising edge of the master clock signal Mclk after the stop signal is received. In some embodiments, the counter_enable signal is used to de-activate the coarse counter before or after the second rising edge of the master clock signal Mclk after the stop signal is received.

A most significant bits (MSB) signal is generated based on the counter_enable signal and the master clock signal Mclk in operation 612. The MSB signal is used to measure a time period between the start of the ramp voltage increasing and a predetermined number of clock cycles of the master clock signal Mclk after the stop signal is received, e.g., tm (FIG. 2). In some embodiments, the MSB signal is generated by the coarse counter, e.g., coarse counter 114 (FIG. 1).

In operation 614, a least significant bits (LSB) signal is generated based on the stop signal, the clk_stop signal and a control signal. The LSB signal is used to measure a time period between receipt of the stop signal and a transition of the clk_stop signal, e.g., time period tf (FIG. 2). In some embodiments, the LSB signal is generated by the delay line counter, e.g., delay line counter 116 (FIG. 1). In some embodiments, the control signal is used to determine a mode in the delay line counter. In some embodiments, the delay line counter uses the clk_stop signal for CDS in order to increase an accuracy of the LSB signal, which in turn increases the accuracy of the output of the image sensor. In some embodiments, the control signal, e.g., control signal Vc, is used to alternate a mode of the delay line counter.

In operation 616, an output signal is generated based on the LSB signal and the MSB signal. The output signal is a digital representation of the input signal received from the pixel array. In some embodiments, the output signal is generated using an LVDS, e.g., LVDS 130b (FIG. 1). In some embodiments, the output signal is generated using a horizontal scanner, e.g., horizontal scanner 130a.

In some embodiments, an order of the operations of method 600 is changed. In some embodiments, additional operations are included in method 600. In some embodiments, at least one operation from method 600 is omitted or combined with another operation.

One aspect of this description relates to a time to digital converter (TDC). The TDC includes a synchronizer configured to receive a stop signal and a master clock signal, wherein the synchronizer is configured to generate a clock stop signal and a counter enable signal. The TDC further includes a coarse counter configured to receive the master clock signal and the counter enable signal, wherein the coarse counter is configured to generate a most significant bits (MSB) signal based on the counter enable signal and the master clock signal. The TDC further includes a delay line counter configured to receive the stop signal and the clock stop signal, wherein the delay line counter is configured to generate a least significant bits (LSB) signal based on the stop signal and the clock stop signal, and the delay line counter is further configured to perform correlated double sampling (CDS).

Another aspect of this description relates to an image sensor. The image sensor includes a pixel array configured to receive incident light and to generate a first input signal. The image sensor further includes a comparator configured to receive the first input signal and to generate a stop signal. The image sensor further includes a time to digital converter (TDC) configured to receive the stop signal. The TDC includes a synchronizer configured to receive the stop signal and a master clock signal, wherein the synchronizer is configured to generate a clock stop signal and a counter enable signal. The TDC further includes a coarse counter configured to receive the master clock signal and the counter enable signal, wherein the coarse counter is configured to generate a first output signal based on the counter enable signal and the master clock signal. The TDC further includes a delay line counter configured to receive the stop signal and the clock stop signal, wherein the delay line counter is configured to generate a second output signal based on the stop signal and the clock stop signal, and the delay line counter is further configured to perform correlated double sampling (CDS).

Still another aspect of this description relates to a method of using an image sensor. The method includes generating a stop signal based on an input signal from a pixel array. The method further includes generating a clock stop signal and a counter enable signal based on the stop signal and a master clock signal. The method further includes generating a least significant bits (LSB) output based on the stop signal and the clock stop signal. The method further includes generating a most significant bits (MSB) output based on the counter enable signal and the master clock signal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A time to digital converter (TDC) comprising:
   a synchronizer configured to receive a stop signal and a master clock signal, wherein the synchronizer is configured to generate a clock stop signal and a counter enable signal;
   a coarse counter configured to receive the master clock signal and the counter enable signal, wherein the coarse counter is configured to generate a most significant bits (MSB) signal based on the counter enable signal and the master clock signal; and
   a delay line counter, wherein the delay line counter is configured to generate a least significant bits (LSB) signal based on the stop signal and the clock stop signal, and the delay line counter is further configured to perform correlated double sampling (CDS).

2. The TDC of claim 1, wherein the delay line counter comprises:
   a first delay element configured to receive the stop signal;
   a second delay element configured to receive an output of the first delay element;
   a first flip-flop configured to selectively receive the output of the first delay element;
   a second flip-flop configured to selectively receive the output of the second delay element; and
   an encoder configured to receive an output of the first flip-flop and an output of the second flip-flop.

3. The TDC of claim 2, wherein the second flip-flop is further configured to selectively receive an output of the first flip-flop.

4. The TDC of claim 2, wherein the delay line counter further comprises:
   a first delay multiplexer configured to selectively transmit the output of the first delay element to the first flip-flop; and
   a second delay multiplexer configured to selectively transmit the output of the second delay element to the second flip-flop.

5. The TDC of claim 2, wherein the delay line counter further comprises a clock multiplexer, wherein the clock multiplexer is configured to selectively transmit the master clock signal or the clock stop signal to the first flip-flop and to the second flip-flop.

6. The TDC of claim 2, wherein the encoder is configured to output a thermometer code.

7. The TDC of claim 1, wherein the synchronizer is configured to generate the clock stop signal on a second rising edge of the master clock signal after the stop signal is received.

8. An image sensor comprising:
   a pixel array configured to receive incident light and to generate a first input signal;
   a comparator configured to receive the first input signal and to generate a stop signal;
   a time to digital converter (TDC) configured to receive the stop signal, wherein the TDC comprises:
      a synchronizer configured to receive the stop signal and a master clock signal, wherein the synchronizer is configured to generate a clock stop signal and a counter enable signal;
      a coarse counter configured to receive the master clock signal and the counter enable signal, wherein the coarse counter is configured to generate a first output signal based on the counter enable signal and the master clock signal; and
      a delay line counter configured to receive the stop signal and the clock stop signal, wherein the delay line counter is configured to generate a second output signal based on the stop signal and the clock stop signal, and the delay line counter is further configured to perform correlated double sampling (CDS).

9. The image sensor of claim 8, further comprising a ramp generator configured to generate a ramp voltage, wherein the comparator is configured to generate the stop signal based on the first input signal and the ramp voltage.

10. The image sensor of claim 8, wherein a single column of the pixel array is configured to generate the first input signal.

11. The image sensor of claim 8, wherein the delay line counter comprises:
  a plurality of delay elements, wherein a first delay element of the plurality of delay elements is configured to receive the stop signal and each other delay element of the plurality of delay elements is configured to receive an output from a preceding delay element of the plurality of delay elements;
  a plurality of flip-flops configured to selectively receive an output of a corresponding delay element of the plurality of delay elements; and
  an encoder configured to receive an output of each flip-flop of the plurality of flip-flops.

12. The image sensor of claim 11, wherein at least one flip-flop of the plurality of flip-flops is configured to receive an output from a preceding flip-flop of the plurality of flip-flops.

13. The image sensor of claim 11, wherein the delay line counter further comprises:
  a plurality of delay multiplexers configured to selectively transmit an output from a delay element of the plurality of delay elements to a corresponding flip-flop of the plurality of flip-flops.

14. The image sensor of claim 11, wherein the delay line counter further comprises a clock multiplexer configured to selectively transmit the clock stop signal or the master clock signal to each flip-flop of the plurality of flip-flops.

15. The image sensor of claim 11, wherein the encoder is configured to output a thermometer code.

16. The image sensor of claim 8, wherein the synchronizer is configured to generate the clock stop signal on a second rising edge of the master clock signal after the stop signal is received.

17. A method of using an image sensor, the method comprising:
  generating a stop signal based on an input signal from a pixel array;
  generating a clock stop signal and a counter enable signal based on the stop signal and a master clock signal;
  generating a least significant bits (LSB) output using a delay line counter configured to receive the stop signal and the clock stop signal; and
  generating a most significant bits (MSB) output based on the counter enable signal and the master clock signal.

18. The method of claim 17, wherein generating the LSB output comprises performing correlated double sampling (CDS) in the delay line counter.

19. The method of claim 17, wherein generating the stop signal comprises generating the stop signal based on a comparison between the input signal and a ramp voltage.

20. The method of claim 17, wherein generating the clock stop signal comprises generating the clock stop signal on a second rising edge of the master clock signal after receiving the stop signal.

\* \* \* \* \*